(12) United States Patent
Chen et al.

(10) Patent No.: US 12,250,002 B2
(45) Date of Patent: Mar. 11, 2025

(54) ANALOG DIGITAL CONVERTER

(71) Applicant: UNITED MICROELECTRONICS CORP., Hsinchu (TW)

(72) Inventors: Po-Hua Chen, Changhua County (TW);
Yu-Yee Liow, Hsinchu County (TW);
Chih-Wei Wu, Kaohsiung (TW);
Wen-Hong Hsu, Hsinchu (TW);
Hsuan-Chih Yeh, New Taipei (TW);
Pei-Wen Sun, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 176 days.

(21) Appl. No.: 18/127,262

(22) Filed: Mar. 28, 2023

(65) Prior Publication Data
US 2024/0305310 A1    Sep. 12, 2024

(30) Foreign Application Priority Data
Mar. 10, 2023  (TW) .................................. 112108888

(51) Int. Cl.
*H03M 1/46*    (2006.01)

(52) U.S. Cl.
CPC ..................... *H03M 1/46* (2013.01)

(58) Field of Classification Search
CPC ...... H03M 1/468; H03M 1/462; H03M 1/804; H03M 1/1245; H03M 1/466; H03M 1/46; H03M 1/1225; H03M 1/12; H03M 1/38; H03M 1/00; H03M 1/002; H03M 1/164; H03M 1/1205; H03M 1/1215; H03M 1/001; H03M 1/0863; H03M 1/662; H03M 1/34; H03M 3/47; H03M 3/474

USPC .......................... 341/141, 144, 155, 161, 172
See application file for complete search history.

(56) References Cited

U.S. PATENT DOCUMENTS

| | | | | |
|---|---|---|---|---|
| 4,940,981 A | * | 7/1990 | Naylor | ................ H03M 1/0607 341/161 |
| 5,691,722 A | * | 11/1997 | Wang | ...................... H03M 1/42 341/161 |
| 6,239,734 B1 | * | 5/2001 | Bae | ....................... H03M 1/144 341/163 |

(Continued)

OTHER PUBLICATIONS

Tsai et al. "A 0.003 mm 10 b 240 MS/s 0.7 mW SAR ADC in 28 nm CMOS With Digital Error Correction and Correlated-Reversed Switching", Jun. 2015, IEEE.

*Primary Examiner* — Linh V Nguyen
(74) *Attorney, Agent, or Firm* — WPAT, PC

(57) ABSTRACT

A SAR ADC includes: a sample-hold (S/H) circuit sampling an input voltage to generate a S/H output signal; a DAC generating a DAC output signal; a comparator comparing the DAC output signal with the S/H output signal to generate a comparison output signal; a SAR combinational digital circuit group; a multiplexer circuit; and a plurality of registers for registering the comparison output signal as register output signals and outputting as an output signal of the SAR ADC. The SAR combinational digital circuit group generates a plurality of first and second SAR output signals based on the register output signals. The multiplexer circuit is controlled by on the register output signals to select among the first and the second SAR output signals as a plurality of multiplexer output signals for sending to the DAC. A capacitor coupling relationship of the DAC is controlled by the multiplexer output signals.

7 Claims, 5 Drawing Sheets

(56) References Cited

U.S. PATENT DOCUMENTS

| | | | |
|---|---|---|---|
| 6,809,674 B1* | 10/2004 | Ramsden | H03M 1/1225 |
| | | | 341/155 |
| 7,199,746 B1 | 4/2007 | Chowdhury | |
| 7,439,898 B1* | 10/2008 | Nittala | H03M 1/462 |
| | | | 341/163 |
| 7,999,719 B2 | 8/2011 | Jeon | |
| 8,223,044 B2 | 7/2012 | Snedeker | |
| 9,509,326 B1* | 11/2016 | Kauffman | H03M 1/1009 |
| 9,998,138 B1* | 6/2018 | Wang | H03M 1/1215 |
| 11,245,408 B2 | 2/2022 | Xu | |
| 11,245,412 B2 | 2/2022 | Chao | |
| 2013/0099953 A1 | 4/2013 | Tsai | |
| 2019/0166325 A1* | 5/2019 | Kim | H04N 25/772 |
| 2022/0077867 A1* | 3/2022 | An | H03M 1/1061 |
| 2023/0163778 A1* | 5/2023 | Cho | H03M 1/468 |
| | | | 341/161 |
| 2023/0336184 A1* | 10/2023 | Huang | H03M 1/0692 |
| 2023/0361780 A1* | 11/2023 | Berens | H03M 1/468 |
| 2023/0421168 A1* | 12/2023 | Iqbal | H03M 1/462 |

\* cited by examiner

ANALOG DIGITAL CONVERTER

This application claims the benefit of Taiwan application Serial No. 112108888, filed Mar. 10, 2023, the subject matter of which is incorporated herein by reference.

TECHNICAL FIELD

The disclosure relates in general to an analog digital converter (ADC).

BACKGROUND

Successive-approximation register ADC (SAR ADC) converts continuous analog signals into discrete digital signals. In circuit design, SAR ADC has small circuit area and low power consumption. Thus, SAR ADC becomes main stream. Until now, SAR ADC is widely used in many fields, including flow control, medial systems and digital sound system.

However, SAR ADC has slow conversion speed. Thus, there is a need to solve the low conversion speed of the SAR ADC.

SUMMARY

According to one embodiment, provided is a successive-approximation register (SAR) analog digital converter (ADC) comprising: a sample-hold circuit sampling an input voltage based on a system clock to generate a sample-hold output signal; a digital analog converter (DAC) generating a DAC output signal; a comparator coupled to the sample-hold circuit and the DAC, the comparator comparing the sample-hold output signal with the DAC output signal to generate a comparing output signal; a SAR combinational digital circuit group; a multiplexer circuit coupled to the DAC and the SAR combinational digital circuit group; and a plurality of registers coupled to the comparator, the SAR combinational digital circuit group and the multiplexer circuit, wherein the comparing output signal from the comparator is registered in the registers as a plurality of register output signals, the registers output the register output signals as an output signal of the SAR ADC. The SAR combinational digital circuit group generates a plurality of first SAR output signals and a plurality of second SAR output signals based on the register output signals. The SAR combinational digital circuit group includes a first SAR combinational digital circuit and a second SAR combinational digital circuit, the first SAR combinational digital circuit generates the first SAR output signals based on the register output signals, the second SAR combinational digital circuit generates the second SAR output signals based on the register output signals. The multiplexer circuit selects the first SAR output signals or the second SAR output signals as a plurality of multiplexer output signals under control of the register output signals and sends the plurality of multiplexer output signals to the DAC. A capacitor coupling relationship of the DAC is controlled by the multiplexer output signals.

Figure 1:
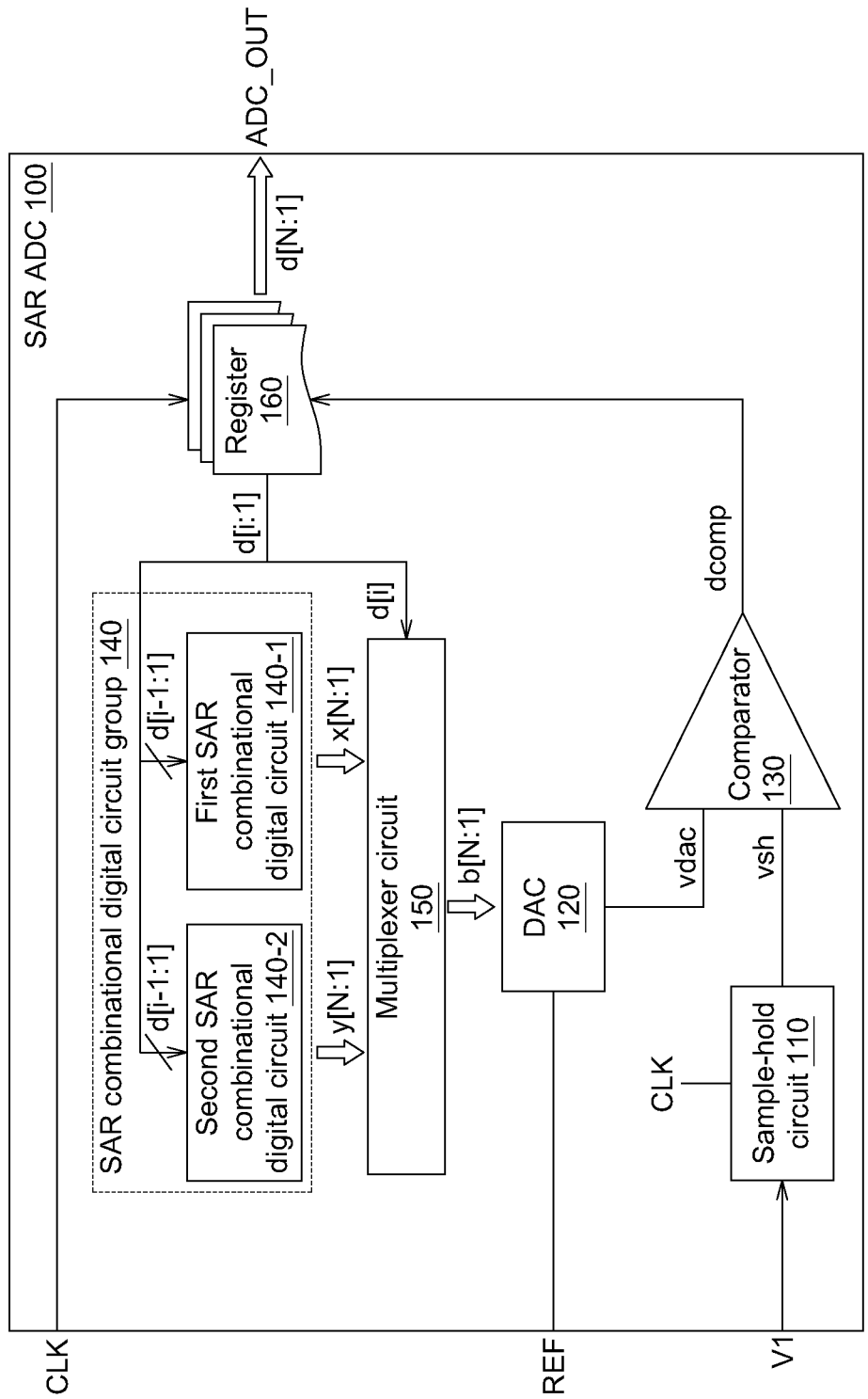
FIG. 1 shows a functional block diagram of a successive-approximation register (SAR) analog-digital converter (ADC) according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a successive-approximation register (SAR) analog-digital converter (ADC) according to one embodiment of the application. As shown in FIG. 1, the SAR ADC 100 according to one embodiment of the application includes a sample-hold circuit 110, a DAC (digital-to-analog converter) 120, a comparator 130, a SAR combinational digital circuit group 140, a multiplexer circuit 150 and a plurality of registers 160. The registers 160 are for example but not limited by, D-type flip-flops.

The sample-hold circuit 110 samples an input voltage VI based on a system clock CLK to generate a sample-hold output signal vsh and sends to the comparator 130.

The DAC 120 receives a reference voltage REF. The DAC 120 generates a DAC output signal vdac under control of the multiplexer output signals b[N:1] of the multiplexer circuit 150 and sends to the comparator 130. The reference voltage REF input to the DAC 120 defines a Least Significant Bit (LSB) of a voltage. For example but not limited by, when the DAC 120 is a N-bit binary DAC, then LSB=REF/(2^N).

The comparator 130 is coupled to the sample-hold circuit 110 and the DAC 120. The comparator 130 compares the sample-hold output signal vsh with the DAC output signal vdac to generate a comparing output signal dcomp. The comparing output signal dcomp of the comparator 130 is registered in the registers 160 to output as register output signals d[i], i=N~1.

The SAR combinational digital circuit group 140 is coupled to the registers 160. The SAR combinational digital circuit group 140 generates a plurality of first SAR output signals x[N:1] and a plurality of second SAR output signals y[N:1] based on the register output signals d[i:1] from the registers 160. The SAR combinational digital circuit group 140 includes a first SAR combinational digital circuit 140-1 and a second SAR combinational digital circuit 140-2. The first SAR combinational digital circuit 140-1 and the second SAR combinational digital circuit 140-2 are coupled to the registers 160. The first SAR combinational digital circuit 140-1 generates the first SAR output signals x[N:1] based on the register output signals d[i−1:1] from the registers 160;

and the second SAR combinational digital circuit 140-2 generates the second SAR output signals y[N:1] based on the register output signals d[i−1:1] from the registers 160.

The multiplexer circuit 150 is coupled to the DAC 120, the SAR combinational digital circuit group 140 and the registers 160. The multiplexer circuit 150 outputs a plurality of multiplexer output signals b[N:1] to the DAC 120 based on the first SAR output signals x[N:1], the second SAR output signals y[N:1] and the register output signals d[i] from the registers 160. A capacitor coupling relationship of the DAC 120 is controlled by the multiplexer output signals b[N:1].

The registers 160 output the register output signals d[N:1] as an output signal ADC_OUT of the SAR ADC 100, wherein ADC_OUT=d[N:1].

Figure 2:
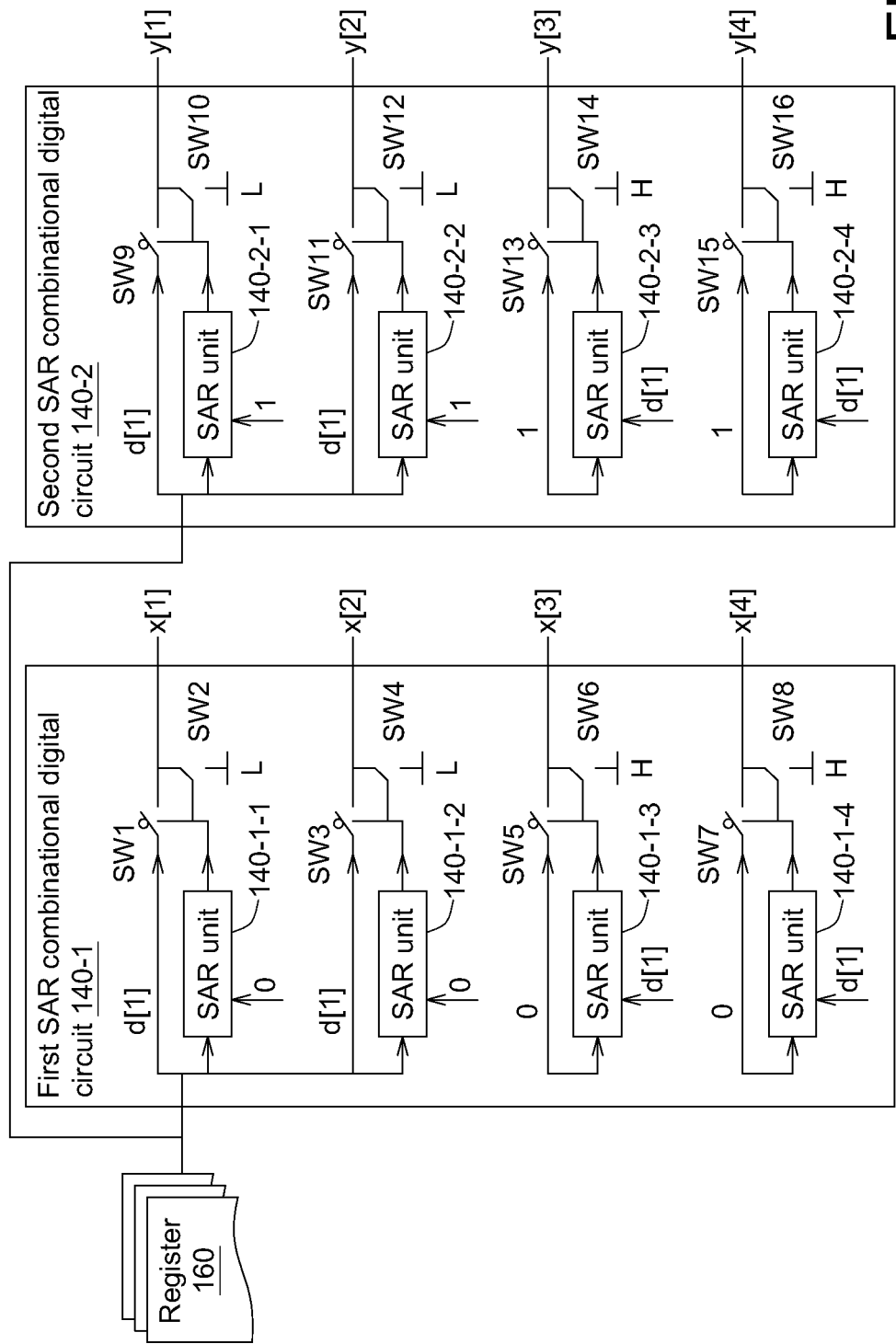
FIG. 2 shows a detailed function block diagram of a SAR combinational digital circuit group of a SAR ADC according to one embodiment of the application.

FIG. 2 shows detailed function block diagram of the SAR combinational digital circuit group of the SAR ADC according to one embodiment of the application. The first SAR combinational digital circuit 140-1 includes a plurality of SAR units 140-1-1~140-1-4 and a plurality of switches SW1~SW8. The second SAR combinational digital circuit 140-2 includes a plurality of SAR units 140-2-1~140-2-4 and a plurality of switches SW9~SW16. The SAR units 140-1-1~140-1-4 and 140-2-1~140-2-4 are for example but not limited by XOR logic gates.

The SAR units 140-1-1~140-1-4 generate a plurality of SAR intermediate output signals based on the register output signal d[i] from the registers 160 and a first reference value (for example but not limited by logic 0). The switches SW1~SW8 are controlled by the SAR intermediate output signals from the SAR unit 140-1-1~140-1-4 to conduct the comparing output signals or the first reference value as the first SAR output signals, or pulls high or low the first SAR output signals. When the switches SW1 and SW3 are conducted, x[1]=d[1]; and when the switches SW5 and SW7 are conducted, x[1]=0. When the switches SW2 and SW4 are conducted, x[1]=L (pulling low); and when the switches SW6 and SW8 are conducted, x[1]=H (pulling high). For example but not limited by, when the SAR intermediate output signal from the SAR unit 140-1-1 is logic 1, the switch SW1 is disconnected while the switch SW2 is conducted. When the SAR intermediate output signal of the SAR unit 140-1-1 is logic 0, the switch SW1 is conducted while the switch SW2 is disconnected. Operations of the switches SW3~SW8 are similar.

The SAR units 140-2-1~140-2-4 generate the SAR intermediate output signals based on the register output signals d[i] from the registers 160 and a second reference value (for example but not limited by logic 1). The switches SW9~SW16 are controlled by the SAR intermediate output signals from the SAR units 140-2-1~140-2-4, to conduct the comparing output signals or the second reference value as the second SAR output signals, or pull high or low the second SAR output signals. For example but not limited by, when the SAR intermediate output signal from the SAR unit 140-2-1 is logic 1, the switch SW9 is disconnected while the switch SW10 is conducted. When the SAR intermediate output signal from the SAR unit 140-2-1 is logic 0, the switch SW9 is conducted while the switch SW10 is disconnected. Operations of the switches SW11~SW16 are similar.

When the switch SW1 is conducted and the switch SW2 is disconnected, the first SAR output signal x[1] is the register output signal d[1] from the registers 160. When the switch SW1 is disconnected and the switch SW2 is conducted, the first SAR output signal x[1] is logic 0. Generation of the first SAR output signals x[N:1] and the second SAR output signals y[N:1] are similar.

Figure 3:
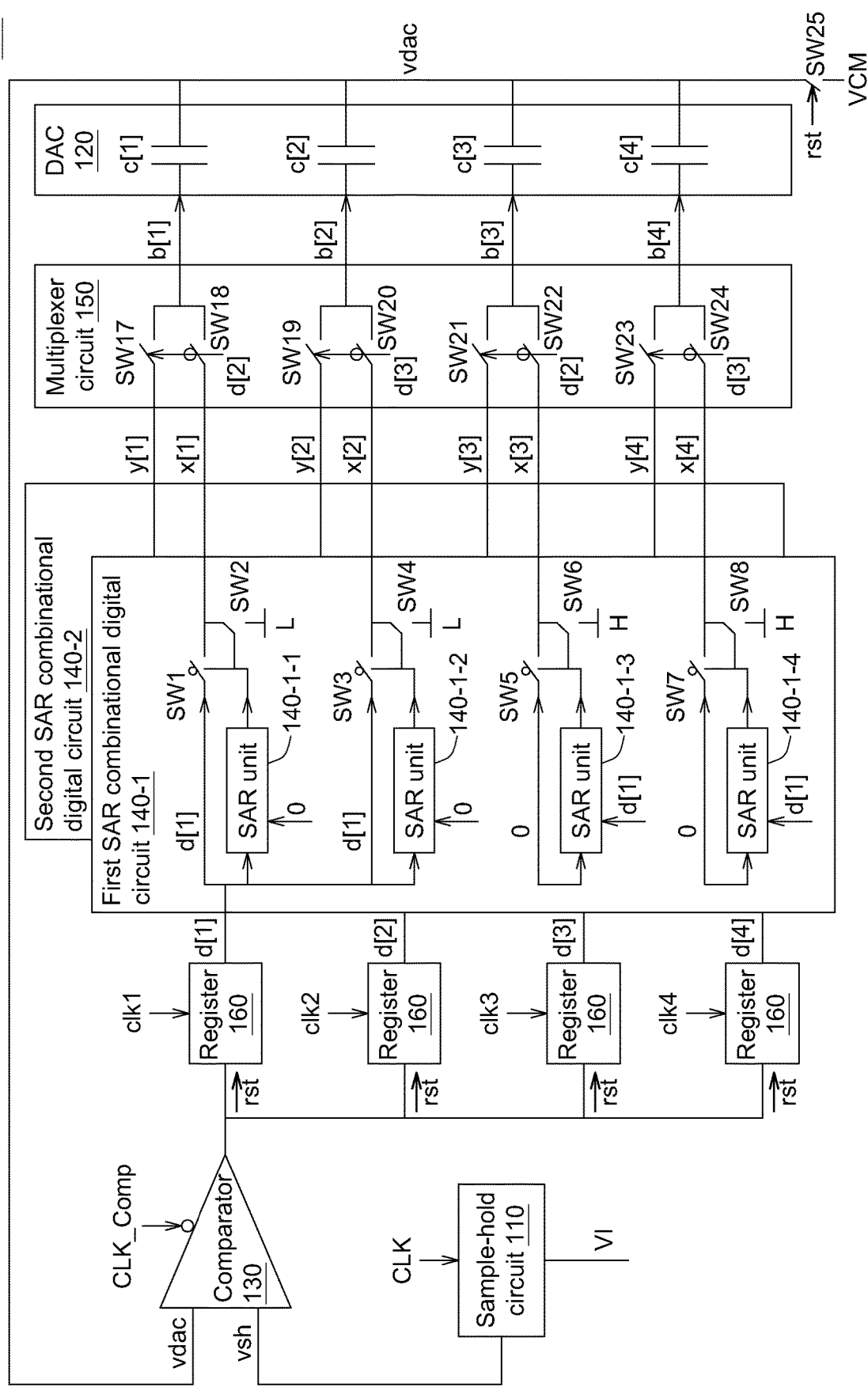
FIG. 3 shows operations of a SAR ADC according to one embodiment of the application.

FIG. 3 shows operations of the SAR ADC according to one embodiment of the application. The multiplexer circuit 150 includes a plurality of switches SW17~SW24, wherein the switches SW17~SW24 are controlled by the register output signal d[2] or d[3] of the registers 160. Taking the switches SW17 and SW18 as an example, when the register output signal d[2] is logic 1, the switch SW17 is conducted and the switch SW18 is disconnected. When the register output signal d[2] is logic 0, the switch SW17 is disconnected and the switch SW18 is conducted. Operations of the switches SW19-SW24 are similar. When the switch SW17 is conducted and the switch SW18 is disconnected, the multiplexer circuit 150 selects the first SAR output signal x[1] as the multiplexer output signal b[1]. When the switch SW17 is disconnected and the switch SW18 is conducted, the multiplexer circuit 150 selects the second SAR output signal y[1] as the multiplexer output signal b[1].

Further, in one embodiment of the application, the SAR ADC 100 further includes a switch SW25 coupled to the DAC 120. The switch SW25 resets the DAC output signal vdac to a common voltage VCM based on a control signal rst. For example but not limited by, when the control signal rst is logic high, the switch SW25 is conducted to reset the DAC output signal vdac to the common voltage VCM. When the control signal rst is logic low, the switch SW25 is disconnected.

The DAC 120 includes a plurality of capacitors c[1]~c[4]. Coupling relationship of the capacitors c[1]~c[4] are controlled by the multiplexer output signals b[1]~b[4]. For example but not limited by, when the multiplexer output signal b[1] is logic high, the capacitor c[1] is coupled to a reference voltage (not shown); and when the multiplexer output signal b[1] is logic low, the capacitor c[1] is coupled to a ground terminal.

Further, the registers 160 receive clock signals clk1~clk4. The registers 160 are further controlled by the control signal rst. For example but not limited by, a first register 160 among the registers 160 receives the clock signal clk1, and when the control signal rst is logic low, the first register 160 among the registers 160 outputs the register output signal d[1] to the SAR units 140-1-1~140-1-4 and the SAR units 140-2-1~140-2-4. A second register 160 among the registers 160 receives the clock signal clk2, and when the control signal rst is logic high, the second register 160 among the registers 160 outputs the register output signal d[2] to the SAR units 140-1-1~140-1-4 and the SAR units 140-2-1~140-2-4. A third register 160 among the registers 160 receives the clock signal clk3, and when the control signal rst is logic high, the third register 160 among the registers 160 outputs the register output signal d[3] to the SAR units 140-1-1~140-1-4 and the SAR units 140-2-1~140-2-4. A fourth register 160 among the registers 160 receives the clock signal clk4, and when the control signal rst is logic high, the fourth register 160 among the registers 160 outputs the register output signal d[4] to the SAR units 140-1-1~140-1-4 and the SAR units 140-2-1~140-2-4.

Figure 4:
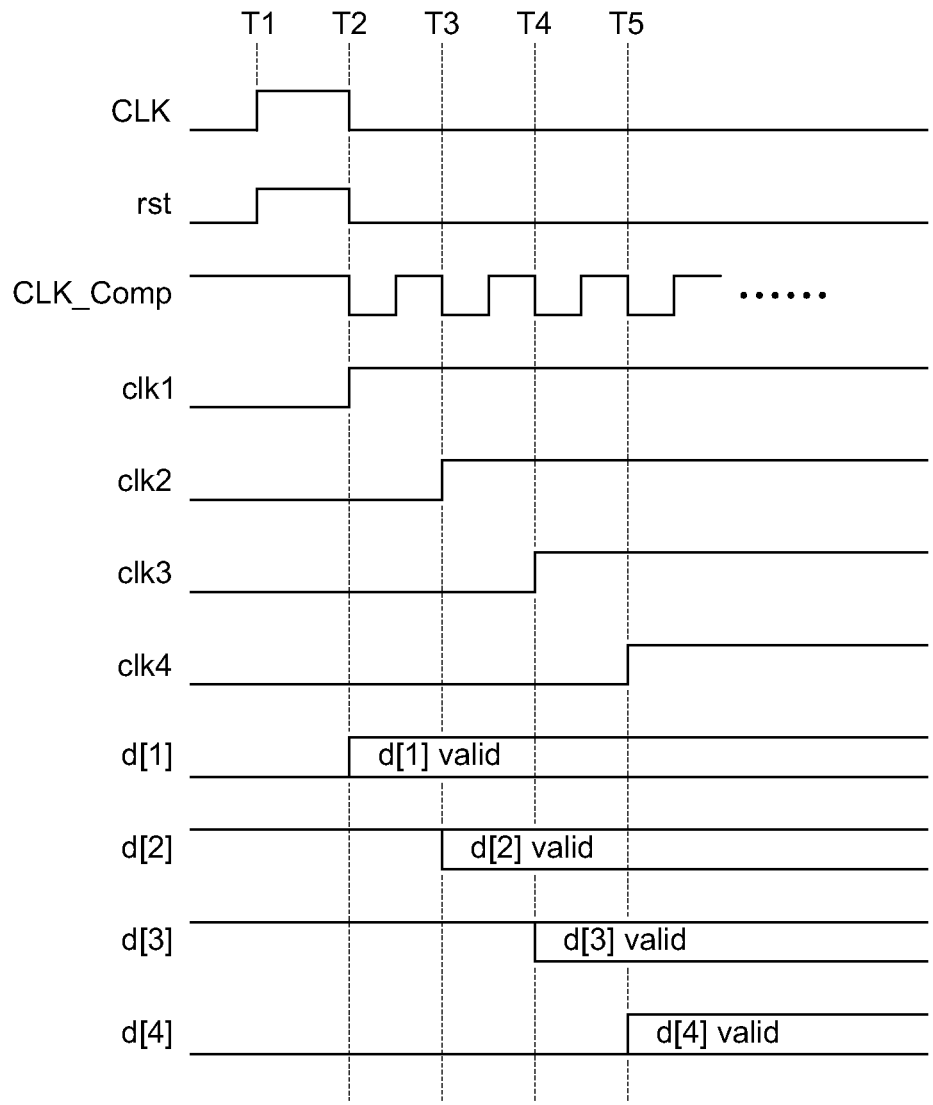
FIG. 4 shows a signal timing diagram of a SAR ADC according to one embodiment of the application.

FIG. 4 shows a signal timing diagram of the SAR ADC according to one embodiment of the application. Referring to FIG. 3 and FIG. 4 to show operations of the SAR ADC according to one embodiment of the application.

Here, the SAR ADC 100 is a 4-bit ADC (N=4), which is an example but not to limit the application.

At the timing T1, the system clock CLK is CLK=H and the control signal rst is rst=H. When system clock CLK=H, the sample-hold circuit 110 samples the input voltage VI; and in response to rst=H, the registers 160 are reset and thus the registers 160 generate d[4:1]=[1,1,0,0]. Therefore, x[4:

1]=[0,0,0,0], y[4:1]=[1,1,0,0], b[4:1]=[1,1,0,0]. When the control signal rst is logic high, the switch SW25 is conducted to reset the DAC output signal dac to the common voltage VCM.

At the timing T2, the system clock CLK is CLK=L and the control signal rst is rst=L. The sample-hold circuit 110 stops sampling and generates the sample-hold output signal vsh to the comparator 130. The comparator clock signal CLK_comp transits to logic low, and the comparator 130 performs a first comparison and updates the comparing output signal dcomp to decide the multiplexer output signal b[2,1]. The comparing output signal dcomp output at the first comparison is dcomp=d[1].

In one embodiment of the application, another inputs of the SAR units 140-1-1~140-1-4 are fixed as logic 0; and another inputs of the SAR units 140-2-1~140-2-4 are fixed as logic 1. At the timing T2, when d[1]=L, because another inputs of the SAR units 140-1-1~140-1-4 and 140-2-1~140-2-4 are fixed as logic 0 and logic 1, thus x[4:1]=[0,0,0,0], y[4:1]=[1,1,0,0]. Because at the timing T2, d[2:3] is still the reset value (i.e. logic 1), b[4:1]=y[4:1]=[1,1,0,0].

At timing T2, when d[1]=H, another inputs of the SAR units 140-1-1~140-1-4 are fixed as logic 0 and thus x[4:1]=[1,1,0,0]; and another inputs of the SAR units 140-2-1~140-2-4 are fixed as logic 1, and thus y[4:1]=[1, 1, 1, 1]. Because at the timing T2, d[2:3] is still the reset value (i.e. logic 1), b[4:1]=y[4:1]=[1,1,1,1].

After comparison, the comparator clock signal CLK_comp is transited to logic H.

At timing T3, the comparator clock signal CLK_comp transits to logic low again, and the comparator 130 performs second comparison and updates the comparing output signal dcomp to decide the output signal b[3,1]. The comparing output signal dcomp output at the second comparison is dcomp=d[2].

At timing T3, when d[2]=L and d[1]=L, because another inputs of the SAR unit 140-1-1~140-1-4 and the SAR units 140-2-1~140-2-4 are fixed, b[3,1]=x[3,1]=[0,0].

At timing T3, when d[2]=L and d[1]=H, because another inputs of the SAR unit 140-1-1~140-1-4 and the SAR units 140-2-1~140-2-4 are fixed, b[3,1]=x[3,1]=[1,0].

At timing T3, when d[2]=H and d[1]=L, because another inputs of the SAR unit 140-1-1~140-1-4 and the SAR units 140-2-1~140-2-4 are fixed, b[3,1]=y[3,1]=[1,0].

At timing T3, when d[2]=H and d[1]=H, because another inputs of the SAR unit 140-1-1~140-1-4 and the SAR units 140-2-1~140-2-4 are fixed, b[3,1]=y[3,1]=[1,1].

At timing T3, because d[2] is valid, the valid comparing output signal d[2] controls the switches SW17, SW18, SW21 and SW22 of the multiplexer circuit 150 to generate the updated signals b[1] and b[3], for deciding whether to change the coupling relationship of the capacitors c[1] and c[3].

After the second comparison, the comparator clock signal CLK_comp is transited to H.

At timing T4, the comparator clock signal CLK_comp is transited to logic low, the comparator 130 performs third comparison, and updates the comparing output signal dcomp to decide the multiplexer output signal b[4,2]. The comparing output signal dcomp at third comparison is dcomp=d[3].

At timing T4, when d[3]=L and d[1]=L, because another inputs of the SAR unit 140-1-1~140-1-4 and the SAR units 140-2-1~140-2-4 are fixed b[4,2]=x[4,2]=[0,0].

At timing T4, when d[3]=L and d[1]=H, because another inputs of the SAR unit 140-1-1~140-1-4 and the SAR units 140-2-1~140-2-4 are fixed b[4,2]=x[4,2]=[1,0].

At timing T4, when d[3]=H and d[1]=L, because another inputs of the SAR unit 140-1-1~140-1-4 and the SAR units 140-2-1~140-2-4 are fixed b[4,2]=y[4,2]=[1,0].

At timing T4, when d[3]=H and d[1]=H, because another inputs of the SAR unit 140-1-1~140-1-4 and the SAR units 140-2-1~140-2-4 are fixed b[4,2]=y[4,2]=[1,1].

After the third comparison, the comparator clock signal CLK_comp is transited to H.

At timing T4, because the signal d[3] is valid, the valid comparing output signal d[3] controls the switches SW19, SW20, SW23 and SW24 of the multiplexer circuit 150 to generate the updated signals b[2] and b[4], to decide whether to change the coupling relationship of the capacitors c[2] and c[4].

At timing T5, the comparator clock signal CLK_comp is transited to logic low, the comparator 130 performs fourth comparison, and generates the comparing output signal dcomp (logic low or logic high). The comparing output signal dcomp at the fourth comparison is dcomp=d[4].

After comparing 4 bits, the registers 160 output ADC_OUT=d[4:1].

In prior art, limited by transmission delay of logic operations of SAR digital circuit, the prior SAR ADC has low operation speed.

In one embodiment of the application, via logic design of the SAR combinational digital circuit group 140, the SAR ADC 100 has high operation speed.

Figure 5:
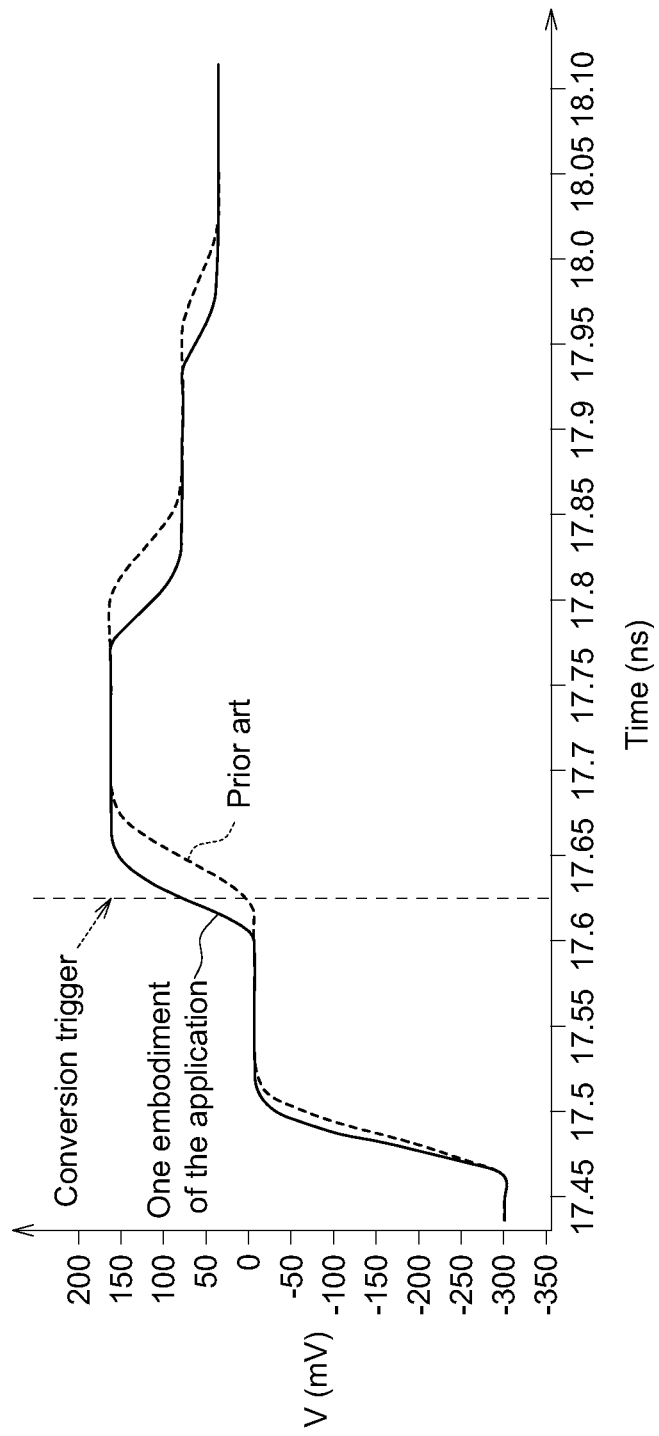
FIG. 5 shows waveforms comparing a prior DAC and a DAC according to one embodiment of the application.

FIG. 5 shows waveforms comparing the prior DAC and the DAC according to one embodiment of the application. As shown in FIG. 5, when conversion is triggered, the DAC 120 according to one embodiment of the application is already converting while the prior DAC just begins to convert. Therefore, as shown in FIG. 5, one embodiment of the application has fast operation speed.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A successive-approximation register (SAR) analog digital converter (ADC) comprising:
   a sample-hold circuit sampling an input voltage based on a system clock to generate a sample-hold output signal;
   a digital analog converter (DAC) generating a DAC output signal;

a comparator coupled to the sample-hold circuit and the DAC, the comparator comparing the sample-hold output signal with the DAC output signal to generate a comparing output signal;

a SAR combinational digital circuit group;

a multiplexer circuit coupled to the DAC and the SAR combinational digital circuit group; and a plurality of registers coupled to the comparator, the SAR combinational digital circuit group and the multiplexer circuit, wherein the comparing output signal from the comparator is registered in the registers as a plurality of register output signals, the registers output the register output signals as an output signal of the SAR ADC, wherein the SAR combinational digital circuit group generates a plurality of first SAR output signals and a plurality of second SAR output signals based on the register output signals, the SAR combinational digital circuit group includes a first SAR combinational digital circuit and a second SAR combinational digital circuit, the first SAR combinational digital circuit generates the first SAR output signals based on the register output signals, the second SAR combinational digital circuit generates the second SAR output signals based on the register output signals, the multiplexer circuit selects the first SAR output signals or the second SAR output signals as a plurality of multiplexer output signals under control of the register output signals and sends the plurality of multiplexer output signals to the DAC;

a capacitor coupling relationship of the DAC is controlled by the multiplexer output signals.

2. The SAR ADC according to claim 1, wherein the first SAR combinational digital circuit includes a plurality of first SAR units and a plurality of first switches;

the second SAR combinational digital circuit includes a plurality of second SAR units and a plurality of second switches;

the first SAR units generate a plurality of first SAR intermediate output signals based on the register output signals and a first reference value;

the first switches conduct the register output signals or the first reference value as the first SAR output signals, or pull high or low the first SAR output signals under control by the first SAR intermediate output signals of the first SAR units;

the second SAR units generate a plurality of second SAR intermediate output signal based on the register output signals and a second reference value; and the second switches conduct the register output signals or the second reference value as the second SAR output signals, or pull high or low the second SAR output signals under control of the second SAR intermediate output signals of the second SAR units.

3. The SAR ADC according to claim 1, wherein the multiplexer circuit includes a plurality of third switches, the third switches select the first SAR output signals or the second SAR output signals as the multiplexer output signals and sends the multiplexer output signals to the DAC under control of the register output signals.

4. The SAR ADC according to claim 1, further including a four switch coupled to the DAC, the fourth switch resets the DAC output signal to a common voltage based on a control signal.

5. The SAR ADC according to claim 1, wherein the registers receive a plurality of clock signals; and the registers output the register output signals to the first SAR combinational digital circuit and the second SAR combinational digital circuit under control of a control signal.

6. The SAR ADC according to claim 2, wherein the registers are D-type flip-flops and the first SAR units and the second SAR units are XOR logic gates.

7. The SAR ADC according to claim 1, wherein at a first timing, the sample-hold circuit samples the input voltage, and in response that the registers are reset, the DAC output signal is reset to a common voltage;

at a second timing, the sample-hold circuit stops sampling and generates the sample-hold output signal to the comparator, the comparator compares and updates the comparing output signal to decide the multiplexer output signals;

at a third timing, the comparator compares and updates the comparing output signal to decide the multiplexer output signals; and in response to the valid register output signals the multiplexer circuit is controlled to generate the updated multiplexer output signals to decide whether to change the capacitor coupling relationship of the DAC; and at a fourth timing, the comparator compares and generates the comparing output signal, and the registers output the output signal of the SAR ADC.

* * * * *